United States Patent [19]

Sibley

[11] 4,091,292

[45] May 23, 1978

[54] FAIL-SAFE MONITOR OF D.C. VOLTAGE

[75] Inventor: Henry C. Sibley, Fairport, N.Y.

[73] Assignee: General Signal Corporation, Rochester, N.Y.

[21] Appl. No.: 775,008

[22] Filed: Mar. 7, 1977

[51] Int. Cl.² .......................... H02H 3/20; H02H 3/24
[52] U.S. Cl. .................................... 307/130; 324/133;
340/248 A; 340/248 B; 340/248 C; 361/90;
361/187
[58] Field of Search ................ 361/86, 90, 91, 92,
361/187; 340/248 A, 248 B, 248 C, 248 D;
307/358, 360, 113, 130; 324/96, 98, 133

[56] References Cited

U.S. PATENT DOCUMENTS

| 2,883,529 | 4/1959 | Marantette | 340/248 A |
| 3,159,825 | 12/1964 | Bianchi et al. | 340/248 A |
| 3,348,132 | 10/1967 | Moyer et al. | 361/187 X |
| 3,492,589 | 1/1970 | Rotier | 340/248 A X |
| 3,852,731 | 12/1974 | Hollands | 340/248 B |

Primary Examiner—Harry E. Moose, Jr.

Attorney, Agent, or Firm—Milton E. Kleinman; George W. Killian

[57] ABSTRACT

In some circumstances it is important to maintain a d.c. potential within a specific range of a critical value. The circuit shown will provide a fail-safe signal if the potential deviates from the allowed range. Two zener diodes and two optically coupled isolators are used. If the d.c. potential remains within the critical range, an a.c. test signal back biases one optically coupled isolator and forward biases the other on the positive half cycle; and on the negative half cycle back biases the other and forward biases the one. Thus the two optically coupled isolators conduct on alternate half cycles of the a.c. test signal. If the d.c. potential strays from the required range, the optically coupled isolators stop alternate conduction and a fail signal is given. If either zener diode should fail in a mode which alters its characteristics so that the circuit would fail to detect a voltage excursion outside the allowed range, a fail signal is given.

14 Claims, 2 Drawing Figures

FAIL-SAFE MONITOR OF D.C. VOLTAGE

BACKGROUND OF THE INVENTION

In some situations, it is necessary to provide a regulated d.c. potential, and many useful circuits have been developed for this purpose. Known voltage regulators are subject to possible malfunction. The present invention does not pertain to voltage regulators, but rather to a circuit for monitoring a potential, which may or may not be regulated, and providing a signal if the potential should rise above, or fall below, critical levels. Detection of a potential excursion outside the allowed limits may be required to prevent the possibility of the connected load producing a false output as a consequence of the improper potential. Prior art monitoring circuits were deficient in that failure of the monitor circuit itself did not result in a fail signal.

The present invention could find utility in a wide range of applications. It was conceived for use with a railroad signalling application wherein an improper d.c. voltage level could result in the production of an improper signal. The present circuit detects the improper voltage excursion and produces an appropriate signal. The monitor may also be used in connection with industrial processes wherein voltage levels are critical, or in various sensing devices wherein the sensing is inaccurate if the applied potential is outside a specified range, or in computer systems which have critical voltage requirements. Many other applications will readily occur to those familiar with the arts requiring a fixed level d.c. potential.

SUMMARY OF THE INVENTION

Very briefly, the monitor circuit comprises a circuit which is bridged across the d.c. potential to be monitored and includes a pair of optically coupled isolators (OCI's). Zener diodes are used to clamp first and second junction points at fixed potentials relative to the negative and positive terminals, respectively, of the d.c. power supply. A testing bridge is coupled between the two clamped potentials to respond to the relationship between the clamped potentials. An a.c. signal in the testing bridge sequentially forward biases first one and then the other of the optically coupled isolators (OCI's), as long as the d.c. potential is within limits. The OCI which is forward biased will conduct, and as long as the OCI's conduct alternately, an indication is provided that the monitored potential is within limits. If the monitored potential should deviate from the allowed limits, the OCI's will not alternately conduct and a fail signal will be given. If the characteristics of either of the zener diodes should change enough to cause a monitor malfunction, the monitor circuit will give a fail signal.

The OCI's may be coupled to any suitable bistable device, such as a fail-safe flip flop which is switched between its two stable states to provide a dynamic output. Other types of detectors could be coupled to the OCI's to suit the requirements of a particular application.

It is an object of this invention to provide a circuit for monitoring a d.c. voltage level and providing an indication if the d.c. potential deviates by more than a fixed amount from the nominal value.

It is another object of this invention to provide a fail-safe monitor circuit to indicate if a monitored d.c. potential deviates from its nominal value by more than predetermined limits.

It is another object of this invention to provide a monitor circuit which will provide a signal if it becomes defective.

It is another object of the invention to provide a fail signal in the event that the characteristics of critical components of the monitor circuit change in such a manner that the monitor circuit would be unable to respond to a voltage excursion beyond the allowed limits.

BRIEF DESCRIPTION OF THE DRAWING

The drawing comprises two figures in which the various circuit elements of the circuit are schematically illustrated. For convenience, electrical elements are identified with a letter and a digit wherein the letter constitutes the first letter of the name of the component.

IN THE DRAWING

Figure 1:
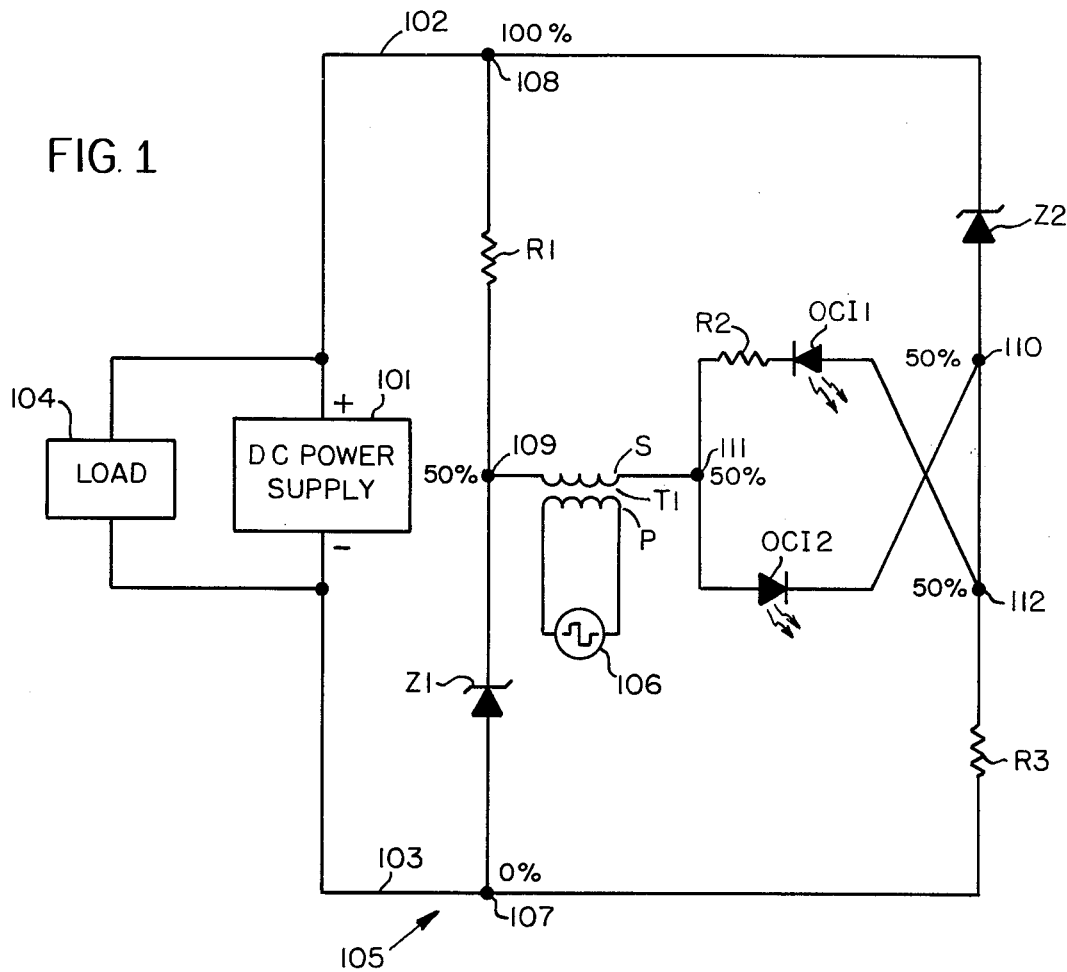

FIG. 1 is a schematic of a circuit comprising the invention; and

Figure 2:
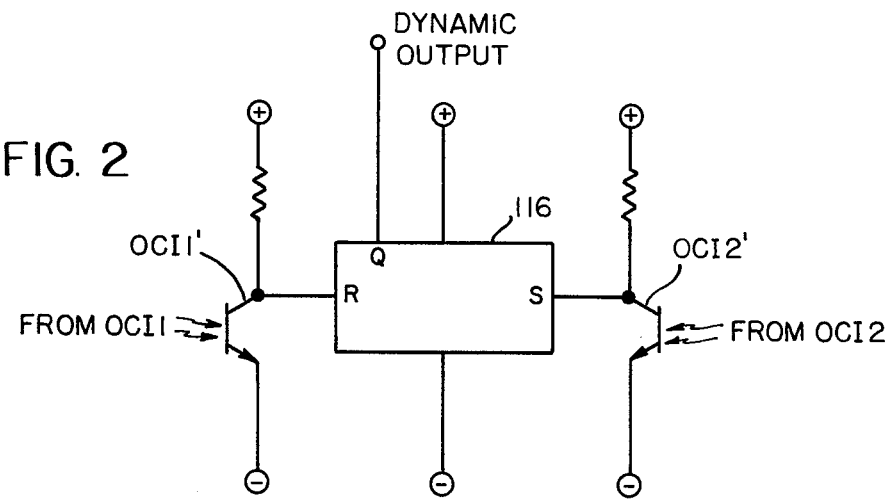

FIG. 2 is a representative associated bistable circuit for responding to the output signals of FIG. 1 and providing a dynamic output as long as the monitored potential is within limits.

DESCRIPTION OF THE PREFERRED EMBODIMENT 101 represents a d.c. power supply having positive and negative output terminals coupled to leads 102 and 103, respectively. Coupled to the d.c. power supply 101 is a load 104. While the d.c. power supply 101 and the load 104 do not constitute the essence of this invention, it should be understood that the load 104 can be expected to produce reliable and consistent output siganls when the output potential of the power supply 101 is maintained within fixed limits. If the output of the d.c. power supply 101 should deviate more than the allowed limit, the load 104 may produce false signals. To prevent possible false signals, it is normal to provide a voltage regulator associated with power supply 101 and to which the load 104 is connected. However, voltage regulators may fail or change characteristics. The monitor circuit of FIG. 1 is designed to monitor a d.c. voltage level and produce a signal indicative of safe operating conditions only so long as the monitored voltage level remains within predetermined limits.

The monitor circuit is indicated generally as 105 and includes: two zener diodes Z1 and Z2; two optically coupled isolators OCI1 and OCI2; three resistors R1, R2 and R3; and a coupling transformer T1 having one side coupled to a signal source 106.

Considering now more specifically the detailed operation of the monitor circuit 105, let it be assumed that the negative lead of the d.c. power supply 101 is at zero, or reference potential, as indicated by the zero percent indication at point 107. In a similar manner, point 108 is at one hundred percent of the potential of the d.c. power supply 101, and this is indicated by the designation one hundred percent at point 108. The zener diode Z1 may be selected to have a breakdown voltage of approximately fifty percent of the nominal value of the d.c. power supply 101. However, a zener diode Z1 could be selected with considerably less breakdown voltage and this would have some convenience in modifying the monitor circuit 105 to function with different voltage levels to be monitored. For the present discussion, however, it will be assumed that the junction point 109 is clamped by zener diode Z1 to approximately fifty percent of the potential of the d.c. power supply 101.

The zener diode Z2 is selected to clamp junction point 110 approximately fifty percent of the nominal voltage of supply 101 below the potential of point 108 with respect to reference potential. This means that as long as the supply 101 is near its rated value, junction points 109 and 110 are at approximately the same potential. Other percentages could be used provided the sum of the percentages at junction points 109 and 110 approximate 100% of the nominal value of the d.c. power supply 101.

For testing purposes, an a.c. signal source 106 is used. The frequency of the a.c. signal source 106 is not critical and may vary from a relatively low frequency of say ten hertz up to a few thousand hertz. The transformer T1 is selected so that the output of the secondary S of transformer T1 has an excursion of approximately four volts peak to peak. That is, if junction point 109 is considered clamped at the fifty percent level by zener diode Z1, the junction point 111 will swing two volts either side of the potential at junction point 109. When the junction point 111 is two volts below the fifty percent potential level, it will be seen that the optically coupled isolator OCI1 is forward biased as junction points 110 and 112 are at the 50 percent voltage level, therefore, the OCI1 will conduct and will emit light. When the junction point 111 is two volts above the 50 percent level, OCI1 will be back biased and will be turned off and stop emitting light.

Resistors R1, R2 and R3 are current limiting resistors. It will be seen that when junction point 111 is two volts above the 50 percent level to back bias OCI1, it will forward bias OCI2 and OCI2 will conduct. Conversely, when junction point 111 switches to two volts below the 50 percent potential level, OCI2 will be back biased and will turn off while OCI1 turns on. Thus, under normal operating conditions, the OCI1 and OCI2 will be alternately turned off and on with one on while the other is off. OCI1 and OCI2 may have coupled phototransistors (see FIG. 2) which switch a flip flop between its two states to implement a fail-safe AND between their outputs. OCI1 and OCI2 may be coupled to other convenient bistable devices to suit the exigencies of the particular application.

LOW VOLTAGE CIRCUIT OPERATION

If the output of the d.c. power supply 101 should drop below its nominal value, the potential at junction point 109 will remain clamped at a fixed potential because of the characteristics of zener diode Z1. However, this means that the potential at junction point 109 will now be more than 50 percent of the output of d.c. power supply 101. Because the zener diode Z2 also has a constant potential across it, the potential at junction point 110 will be less than 50 percent of the nominal value of the d.c. power supply 101. If these differences exceed certain limits, the change in potential at junction point 111, obtained from the effect of the a.c. signal source 106, will not serve to cause the alternate forward and back biasing of OCI1, and it will remain off and thereby provide a signal indicative of the failure of the d.c. power supply 101 to maintain an output potential within the allowable limits.

HIGH VOLTAGE CIRCUIT OPERATION

If the output potential of the d.c. power supply 101 should rise above the allowable limits, the junction point 109 will maintain the same potential level with respect to point 107, but will be at less than 50 percent of the actual voltage of the d.c. power supply 101. In a similar manner, the junction point 110 will be at a potential which is a fixed number of volts below that of lead 102, but which is more than 50 percent of the nominal output value of the d.c. power supply 101 with respect to point 107. Because of the increased difference of potential between junction points 109 and 110, the a.c. signal 106 will not be of sufficient magnitude to forward bias OCI2 and it will remain turned off; and the bistable device of FIG. 2 will provide a signal indicative of the failure of the d.c. power supply 101 to maintain an output potential within the allowed limits.

CIRCUIT OPERATION ON COMPONENT FAILURE

It is usually anticipated that a zener diode will fail either by going open or by short circuiting. In either event, it will be obvious that such failure of zener diode Z1 or Z2 will so materially effect the voltage potential at junction points 109 and/or 110 and 112, that OCI1 and OCI2 will not be switched alternately between the states of forward and reverse bias and that, therefore, a fail signal will be given. However, if the characteristics of zener diode Z1 or Z2 should change as a result of aging, ambient conditions, or any other reason so that their breakdown voltage shifts from the rated value, it will be seen that this will cause a change in the potential at junction points 109 and 110 or 112 which will result in the failure of the optically coupled isolators OCI1 and OCI2 to switch alternately between the states of forward and reverse bias and, therefore, a fail signal will be given. It is significant that this last fail signal results from the failure of the monitor circuit 105 and not the actual failure of the d.c. power supply 101.

It will be fairly evident that if any other circuit component goes open circuited, or the wiring to it becomes disconnected, that the monitor circuit will register a fault. However, if the OCI1 were connected to junction point 110, and the OCI2 were connected to junction point 112, and the wire between junction points 110 and 112 should become disconnected, the OCI2 might remain turned on with current from the positive potential at point 108 through resistor R1, the secondary S of transformer T1 through OCI2 and resistor R3 to the negative potential at lead 103. The OCI1 might continue to function as previously described, thereby providing a safe operating condition signal when the monitor circuit 105 has become at least partially defective. To prevent this possibility, the connection from OCI1 and OCI2 must be made as shown and not as mentioned within this paragraph. That is, if the wire from 110 to 112 should become open circuited, the OCI2 will not remain turned on and a failure will be indicated.

By way of summary, there has been shown a monitor circuit 105 which will respond to the failure of a d.c. power supply to stay within prescribed limits and which will provide an indication if the monitor circuit itself becomes defective and unable to perform the monitor function.

The sensitivity of the monitor circuit 105 may be controlled, in part, by the magnitude of the potential at the secondary of the transformer T1.

THE CIRCUIT OF FIG. 2

The light emitted from the OCI1 and OCI2 turns on the phototransistors OCI1' and OCI2', respectively, of FIG. 2. That is, when OCI1 is emitting light, it will cause the phototransistor OCI1' to conduct and, in a similar manner, when the OCI2 is emitting light, the phototransistor OCI2' will be conducting. Thus, as the OCI1 and OCI2 are alternately biased to conduction, the phototransistors OCI1' and OCI2' will alternately conduct and apply alternate set and reset signals to a fail-safe flip flop 116. The circuit of FIG. 2 is connected to the positive and negative terminals of a suitable power supply as indicated. The flip flop 116 will provide a dynamic output from its Q output terminal. The dynamic output lead Q from flip flop 116 will indicate that the d.c. power supply 101 is providing a potential, to load 104, which is within tolerance. If the monitor circuit 105 of FIG. 1 should fail for any of the reasons suggested, the flip flop 116 will not provide a dynamic output and there will be an indication of failure.

Any of a variety of other bistable circuits could be substituted for that of FIG. 2. For example, a fail-safe polarized relay could be used in place of the flip flop 116, or a square loop core device could be used.

While there has been shown and described what is considered at the present to be a preferred embodiment of the invention, modifications thereto will readily occur to those skilled in the related arts. It is believed that no further analysis or description is required and that the foregoing so fully reveals the gist of the present invention that those skilled in the applicable arts can adapt it to meet the exigencies of their specific requirements. It is not desired, therefore, that the invention be limited to the embodiments shown and described, and it is intended to cover in the appended claims all such modifications as fall within the true spirit and scope of the invention.

What is claimed is:

1. A bridge circuit bridged between first and second reference points for responding to a potential difference between said first and second reference points and comprising in combination:
    (a) a source of a.c. signals having first and second terminals with said first terminal coupled to said first reference point; and
    (b) first and second polarity responsive devices coupled in parallel and in opposite senses between said second reference point and said second terminal of said a.c. signal source for forward biasing one of said polarity responsive devices and reverse biasing the other of said polarity responsive devices in response to any difference of potential and polarity between said second terminal and said second reference point.

2. The combination as set forth in claim 1, wherein said second terminal is driven positive and negative with respect to said second reference point in response to signals from said a.c. source when the potential difference between said first and second reference points does not exceed a predetermined magnitude relative to the peak-to-peak potential of said a.c. signal source.

3. The combination as set forth in claim 2, wherein said polarity responsive devices are coupled to a bistable device for setting and resetting said bistable device in response to each cycle of said a.c. signal source when said predetermined magnitude is not exceeded.

4. A bridge circuit coupled between first and second reference points for responding to a difference of potential between said first and second reference points and wherein;
    (a) said bridge includes a junction point between said first and second reference points and a potential source coupled between said first reference point and said junction point for cyclically altering the potential of said junction point between values above and below the potential of said second reference point; and
    (b) first and second polarity responsive means coupled between said junction point and said second reference point for responding to the changes in polarity between said junction point and said second reference point.

5. The combination as set forth in claim 4, wherein said polarity responsive means are coupled in parallel and in opposite senses for forward biasing one and back biasing the other in response to a difference of potential between said junction point and said second reference point.

6. The combination as set forth in claim 5 and including bistable means coupled to said first and second polarity responsive means for setting and resetting said bistable device in response to the forward biasing of said first and second polarity responsive devices, respectively.

7. A circuit for indicating when a d.c. potential between a reference point and a first point deviates from a first magnitude by more than a second magnitude and comprising in combination:
    (a) first circuit means including a first junction point bridged between said reference point and said first point for clamping said first junction point at a first fixed potential with respect to said reference point;
    (b) second circuit means including a second junction point bridged between said reference point and said first point for clamping said second junction point at a second fixed potential with respect to said first point;
    (c) said first and second fixed potentials summing to approximately said first magnitude;
    (d) third circuit means including a third junction point bridged between said first and second junction points and including control means between said first and third junction points for cyclically adjusting the potential of said third junction point to potentials which are a little above and a little below the clamped potential of said first junction point; and
    (e) fourth and fifth circuit means bridged between said third and second junction points for producing first and second signals when said third junction point is above and below the potential of said first junction point, respectively.

8. The combination as set forth in claim 7 and including bistable means coupled to said fourth and fifth circuit means for producing a dynamic output in response to the alternate production of said first and second signals.

9. The combination as set forth in claim 7, wherein said first and second circuit means include zener diodes.

10. The combination as set forth in claim 8, wherein said control means comprises a source of a.c. signals.

11. The combination as set forth in claim 10, wherein said fourth and fifth circuit means comprise first and second light emitting optically coupled isolators.

12. The combination as set forth in claim 11, wherein said first and second light emitting optically coupled isolators are biased to conduction and nonconduction, respectively, in response to said third junction point being adjusted, by said source of a.c. signals, to a potential a little above the clamped potential of said first junction point.

13. The combination as set forth in claim 12, wherein said second and first light emitting optically coupled isolators are biased to conduction and nonconduction, respectively, in response to said third junction point being adjusted, by said source of a.c. signals, to a potential a little below the clamped potential of said first junction point.

14. The combination as set forth in claim 10, wherein the potential difference between said first and second junction point is less than the peak-to-peak potential of said source of a.c. signals when the instantaneous potential of said source of a.c. signals is zero.

* * * * *